United States Patent
Kim

(10) Patent No.: US 7,884,441 B2
(45) Date of Patent: Feb. 8, 2011

(54) SEMICONDUCTOR DEVICE HAVING POLYSILICON BIT LINE CONTACT

(75) Inventor: Nam Yoon Kim, Anyang-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 253 days.

(21) Appl. No.: 12/273,841

(22) Filed: Nov. 19, 2008

(65) Prior Publication Data

US 2009/0166713 A1    Jul. 2, 2009

(30) Foreign Application Priority Data

Dec. 27, 2007    (KR) ...................... 10-2007-0139265

(51) Int. Cl.
| | |
|---|---|
| H01L 29/00 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 27/10 | (2006.01) |
| H01L 29/739 | (2006.01) |

(52) U.S. Cl. ...................... 257/499; 257/202; 257/377; 257/382; 257/390; 257/401; 257/510; 257/E21.545; 257/E21.546; 257/E29.02; 257/E29.021

(58) Field of Classification Search ................. 257/202, 257/377, 382, 390, 401, 499, 510, E21.545, 257/E21.546, E29.02, E29.021
See application file for complete search history.

(56) References Cited

U.S. PATENT DOCUMENTS

| | | | |
|---|---|---|---|
| 6,436,751 B1 * | 8/2002 | Liou et al. ................. 438/211 |
| 6,512,263 B1 * | 1/2003 | Yuan et al. ................. 257/316 |
| 6,614,072 B2 * | 9/2003 | Sandhu et al. ............. 257/317 |
| 7,309,634 B2 * | 12/2007 | Hong ......................... 438/288 |
| 7,400,010 B2 * | 7/2008 | Matsuno ..................... 257/316 |
| 2003/0030145 A1 * | 2/2003 | Shirai ......................... 257/752 |
| 2003/0203557 A1 * | 10/2003 | Rudeck ....................... 438/200 |
| 2006/0278916 A1 * | 12/2006 | Iino et al. ................... 257/315 |
| 2007/0053223 A1 * | 3/2007 | Choi ...................... 365/185.05 |
| 2007/0267681 A1 * | 11/2007 | Joo et al. .................... 257/315 |
| 2007/0272968 A1 * | 11/2007 | Masukawa et al. .......... 257/315 |
| 2008/0076217 A1 * | 3/2008 | Chien et al. ................ 438/257 |
| 2008/0076218 A1 * | 3/2008 | Lee ............................. 438/257 |

FOREIGN PATENT DOCUMENTS

| | | |
|---|---|---|
| JP | 07-086205 | 3/1995 |
| JP | 08-088337 | 4/1996 |

* cited by examiner

*Primary Examiner*—Ida M Soward
(74) *Attorney, Agent, or Firm*—Saliwanchik, Lloyd & Saliwanchik

(57) ABSTRACT

Provided are a semiconductor device and a method of fabricating the same. The semiconductor device includes a plurality of device isolation layers disposed in a semiconductor substrate, the device isolation layers extending in a word line direction and spaced apart from each other; a plurality of floating gate devices extending in a bit line direction perpendicular to the device isolation layer and spaced apart from each other; a source region and a drain region disposed at sides of the floating gate device; an insulation layer disposed on the floating gate device and the source region, and a polysilicon line extending in the word line direction and connected to the drain region.

8 Claims, 2 Drawing Sheets

SEMICONDUCTOR DEVICE HAVING POLYSILICON BIT LINE CONTACT

CROSS-REFERENCE TO RELATED APPLICATION

The present application claims the benefit under 35 U.S.C. §119 of Korean Patent Application No. 10-2007-0139265, filed Dec. 27, 2007, which is hereby incorporated by reference in its entirety.

BACKGROUND

A common flash memory device is a device making the most use of electrically programmable and erasable characteristics of an electrically erasable programmable read-only memory (EEPROM). This flash memory device utilizes a structure having a tunnel oxide layer of a thin layer on a silicon substrate, a floating gate stacked on the tunnel oxide layer, an insulation layer stacked on the floating gate, a control gate stacked above the floating gate on the insulation layer, and source and drain regions in a substrate at sides of the floating gate. One transistor is used to indicate a state of a stored 1 bit and performs a programming or erasing operation electrically.

The flash memory device typically includes a source connection layer for connecting a source of each unit cell in order to form a source line. The source connection layer may be formed through a metal contact method for forming a contact on a source of each unit for connection. However, the metal contact method tends to be inappropriate for a highly integrated device because its contact margin must be considered. Accordingly, a common source line of an impurity diffusion layer formed through a Self Aligned Source (SAS) process is typically applied to realize the highly integrated device.

The flash memory device uses a first metal layer to form a bit line. The first metal layer connects drains of each unit cell through the metal contact method.

However, according to this metal contact method, the first metal layer is used only for selecting a memory cell.

BRIEF SUMMARY

Embodiments of the present invention provide a semiconductor device.

Embodiments of the present invention provide a semiconductor device where a bit line and a bit line contact are formed through polysilicon.

In one embodiment, a semiconductor device comprises: a plurality of device isolation layers disposed in a semiconductor substrate, the device isolation layers extending in a word line direction and spaced apart from each other; a plurality of floating gate devices extending in a bit line direction perpendicular to the device isolation layers and spaced apart from each other; a source region and a drain region disposed at sides of the floating gate device; an insulation layer disposed on the floating gate device and the source region; and a polysilicon line electrically connected to the drain region.

In another embodiment, a method of fabricating a semiconductor device comprises: forming a plurality of device isolation layers disposed in a semiconductor substrate, the plurality of device isolation layers formed extending in a word line direction and spaced apart from each other; forming a plurality of floating gate devices extending in a bit line direction perpendicular to the device isolation layers and spaced apart from each other; forming a source region and a drain region disposed at sides of the floating gate device; forming an insulation layer disposed on the floating gate device and the source region; and forming a polysilicon line connected to the drain region.

The details of one or more embodiments are set forth in the accompanying drawings and the description below. Other features will be apparent from the description and drawings, and from the claims.

DETAILED DESCRIPTION

Hereinafter, a semiconductor device according to an embodiment will be described in detail with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
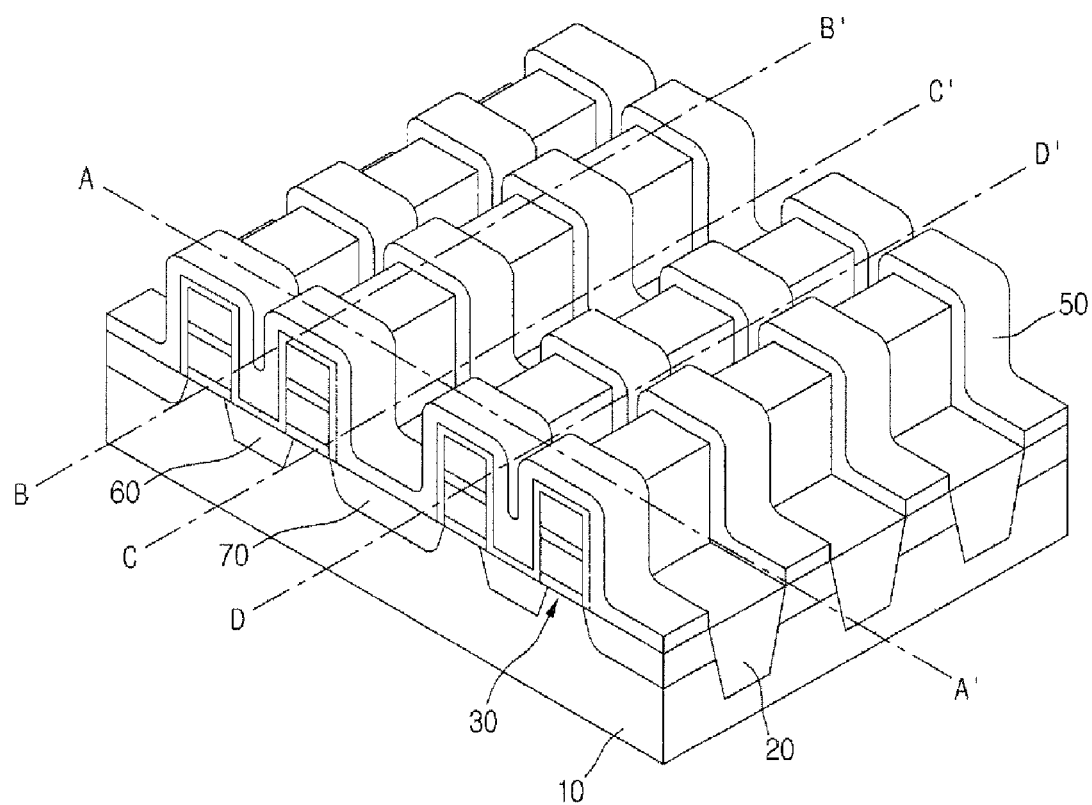
FIG. 1 is a perspective view of a semiconductor device according to an embodiment.
Figure 2:
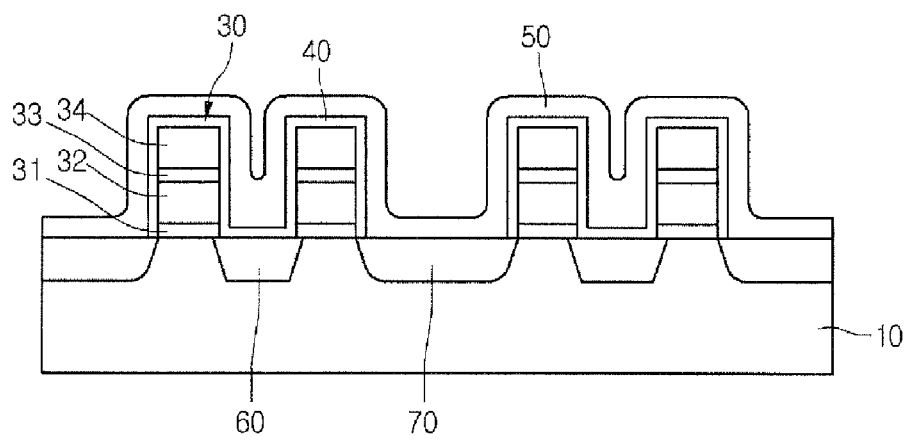
FIG. 2 is a cross-sectional view taken along a line A-A' of FIG. 1.
Figure 3:
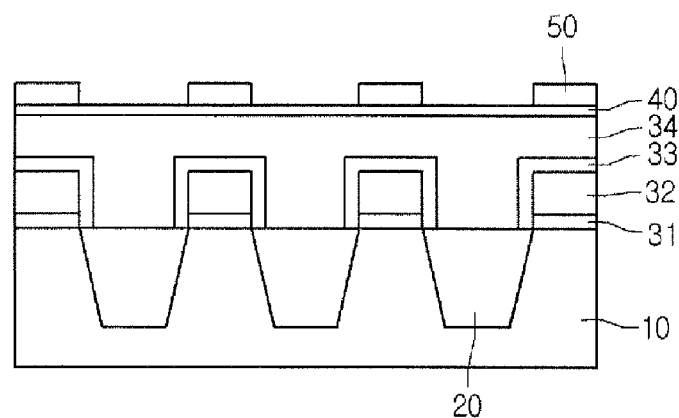
FIG. 3 is a cross-sectional view taken along a line B-B' of FIG. 1.
Figure 4:
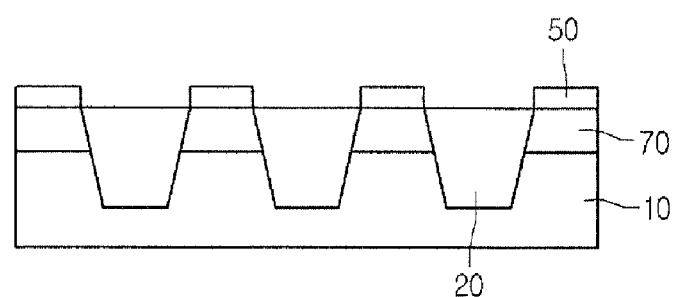
FIG. 4 is a cross-sectional view taken along a line C-C' of FIG. 1.
Figure 5:
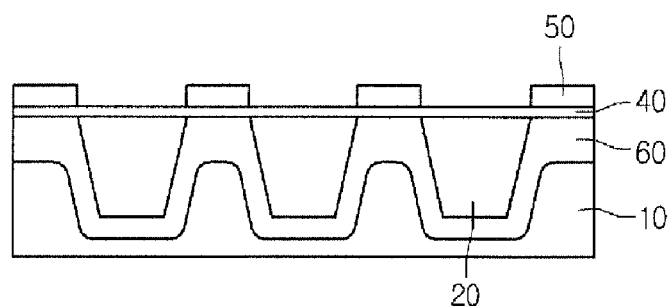
FIG. 5 is a cross-sectional view taken along a line D-D' of FIG. 1.

FIG. 1 is a perspective view of a semiconductor device according to an embodiment. FIG. 2 is a cross-sectional view taken along a line A-A' of FIG. 1. FIG. 3 is a cross-sectional view taken along a line B-B' of FIG. 1. FIG. 4 is a cross-sectional view taken along a line C-C' of FIG. 1. FIG. 5 is a cross-sectional view taken along a line D-D' of FIG. 1.

Referring to FIG. 1, a plurality of device isolation layers 20 are spaced a predetermined distance apart from each other in a semiconductor substrate 10 of the semiconductor device. The device isolation layer 20 can be formed of an insulation layer filled in a trench line in a bit line direction. Additionally, a plurality of floating gates 30 can be formed on the semiconductor substrate 10 in a word line direction perpendicular to the bit line direction.

As illustrated in FIGS. 2 and 3, the floating gate device 30 can include a tunnel oxide layer 31, a floating gate 32, an Oxide-Nitride-Oxide (ONO) layer 33, and a control gate 34.

According to an embodiment, the floating gate device 30 has a structure where the tunnel oxide layer 31, the floating gate 32, the ONO layer 33, and the control gate 34 are sequentially stacked. Alternatively, the floating gate device 30 may be one of related art floating gate devices of other forms.

A source region 60 and a drain region 70, where impurity ions are implanted, can be formed at the sides of the floating gate device 30.

As illustrated in FIG. 5, the source region 60 can be provided as a common source line of an impurity diffusion layer formed through a Self Aligned Source (SAS) process.

In the semiconductor device according to embodiments of the present invention, a bit line and a bit line contact are formed of polysilicon.

As illustrated in FIGS. 1 and 2, a polysilicon line 50 is electrically connected to a drain region 70 formed at one side of the floating gate device 30 in the semiconductor device.

The polysilicon line 50 is formed in plurality and disposed on the semiconductor substrate 10 in a direction perpendicular to the word line. The polysilicon line 50 alternates with the trench line of the device isolation layer 20. That is, when viewed in a plan view, the polysilicon line 50 is in alternation with the trench lines of the device isolation layer 20.

In the semiconductor device, the polysilicon line 50 replaces a related art bit line and bit line contact.

The polysilicon line 50 is electrically connected to the drain region 70, but electrically insulated from the source region 60 and the floating gate device 30.

At this point, an ohmic resistance such as silicide may be formed for an electrical contact between the drain region 70 and the polysilicon line 50.

In addition, an insulation layer 40 is formed on the surface of the floating gate device 30 and the source region 60 to provide electrical insulation. Here, the insulation layer 40 can be formed of an oxide layer or a nitride layer.

In a method of manufacturing a semiconductor device according to an embodiment, a mask pattern is formed on the semiconductor substrate 10 and then the semiconductor substrate 10 is selectively etched in order to a trench line. Next, an insulating material is filled in the trench line to from a device isolation layer 20.

Then, an oxide layer, a polysilicon layer, an ONO layer, and a polysilicon layer can be sequentially stacked on the semiconductor substrate 10 and then patterned to form the plurality of floating gate devices 30 in a direction perpendicular to the trench line.

Next, the source region 60 and the drain region 70 can be formed by implanting impurity ions at the sides of the floating gate device 30.

In addition, an insulation layer 30 is formed on the semiconductor substrate 10, including the floating gate devices 30, and is patterned to expose the drain region 70.

Then, polysilicon is deposited on the insulation layer 40 and patterned to form the polysilicon line 50. In a further embodiment, silicide can be formed on the drain region 70.

As mentioned above, according to the semiconductor device and the method of fabricating the same, since the bit line and bit line contact are formed using polysilicon, they can serve in place of the related art first interlayer insulation and first metal layers.

Moreover, according to the semiconductor device and the method of fabricating the same, since the drain contact is formed using polysilicon, a self aligned drain effect can be obtained.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a plurality of device isolation layers disposed in a semiconductor substrate, the device isolation layers extending in a word line direction and spaced apart from each other;
   a plurality of floating gate devices extending in a bit line direction perpendicular to the device isolation layer and spaced apart from each other;
   a source region and a drain region disposed at sides of the floating gate devices;
   an insulation layer disposed on the floating gate device and the source region; and
   a polysilicon line electrically connected to the drain region.

2. The semiconductor device according to claim 1, wherein the polysilicon line extends in the word line direction.

3. The semiconductor device according to claim 1, wherein the polysilicon line is disposed in alternation with the device isolation layers on the semiconductor substrate.

4. The semiconductor device according to claim 1, wherein the polysilicon line contacts the insulation layer on the floating gate device and the source region.

5. The semiconductor device according to claim 1, wherein the source region is a common source line of an impurity diffusion layer formed through a Self Aligned Source (SAS) process.

6. The semiconductor device according to claim 1, wherein the floating gate device comprises a tunnel oxide layer, a floating gate, an Oxide-Nitride-Oxide (ONO) layer, and a control gate.

7. The semiconductor device according to claim 1, further comprising a silicide on the drain region.

8. The semiconductor device according to claim 7, wherein the polysilicon line contacts the silicide on the drain region.

* * * * *